United States Patent
Moran et al.

(10) Patent No.: US 7,332,928 B2
(45) Date of Patent: Feb. 19, 2008

(54) USE OF A THIRD STATE APPLIED TO A DIGITAL INPUT TERMINAL OF A CIRCUIT TO INITIATE NON-STANDARD OPERATIONAL MODES OF THE CIRCUIT

(75) Inventors: Timothy G. Moran, San Jose, CA (US); Gerald L. Dybsetter, Scotts Valley, CA (US)

(73) Assignee: Finisar Corporation, Sunnyvale, CA (US)

( * ) Notice: Subject to any disclaimer, the term of this patent is extended or adjusted under 35 U.S.C. 154(b) by 138 days.

(21) Appl. No.: 11/074,607

(22) Filed: Mar. 7, 2005

(65) Prior Publication Data

US 2005/0219079 A1  Oct. 6, 2005

Related U.S. Application Data

(60) Provisional application No. 60/550,576, filed on Mar. 5, 2004.

(51) Int. Cl.
*H03K 19/00* (2006.01)
*H03K 19/173* (2006.01)

(52) U.S. Cl. .................. 326/16; 326/37; 326/38; 714/725; 714/726

(58) Field of Classification Search .................. 326/16, 326/37–38; 714/724–726
See application file for complete search history.

(56) References Cited

U.S. PATENT DOCUMENTS

| | | | | |
|---|---|---|---|---|
| 5,068,603 | A * | 11/1991 | Mahoney | 714/726 |
| 5,412,260 | A * | 5/1995 | Tsui et al. | 326/39 |
| 5,905,690 | A * | 5/1999 | Sakurai et al. | 365/233 |
| 5,999,014 | A * | 12/1999 | Jacobson et al. | 326/38 |
| 6,157,210 | A * | 12/2000 | Zaveri et al. | 326/40 |
| 6,253,340 | B1 * | 6/2001 | Cowles et al. | 714/718 |

* cited by examiner

*Primary Examiner*—Rexford Barnie
*Assistant Examiner*—Jason Crawford
(74) *Attorney, Agent, or Firm*—Workman Nydegger

(57) ABSTRACT

A circuit module having one of more digital input terminals that are capable of receiving a third input state to initiate non-standard operational modes such as might be desired during programming or testing of the module or its surrounding circuitry. For each of these special digital input terminals, there is a component that recognizes the presence of the third state applied to the corresponding input terminal. In response, the component generates a signal that causes the module to enter the non-standard operational mode. A non-standard operational mode is a mode other than the normal operational mode of the module. As an example, the non-standard operational mode might be a testing or programming mode that is encountered prior to even shipping the module to a consumer.

18 Claims, 7 Drawing Sheets

```
         H   OP         ADDR                             z2    SP
    PRE  SR  DEV                     BT1 DATA_H  z1 DATA_L     00
     5   33  33  2                   22  22 1   1   11   0 0   00
     3   98  76  532  329  2109      210 10 9   0   10   3 2   10
    ---  --- --- ---  ---  ---       --- ------ --- ------ --- ---                    ←401C
RD: H...H 1 00  110 VVV AAAAAAA  Z B DDDDDDD  0 DDDDDDD 0 1Z
moe:    : *  **  *** *** ******* . *  :***** . . :***** . :*  :
soe:    : .  ..  ... ... ....... .    :***** . . :***** . :*  :
    ---  --- --- ---  ---  ---       --- ------ --- ------ --- ---                    ←404C
WR: H...H 1 00  010 VVV AAAAAAA  0 1 DDDDDDD  0 DDDDDDD 0 1Z
moe:    : *  **  *** *** ******* . *  :***** . . :***** . :*  :
soe:    : .  ..  ... ... ....... .    :***** . . :***** . :*  :
    ---  --- --- ---  ---  ---       --- ------ --- ------ --- ---
     <_|
     +---+  (restart if input not all 1's)
```

Fig. 4C

USE OF A THIRD STATE APPLIED TO A DIGITAL INPUT TERMINAL OF A CIRCUIT TO INITIATE NON-STANDARD OPERATIONAL MODES OF THE CIRCUIT

CROSS-REFERENCE TO RELATED APPLICATIONS

This application claims the benefit of U.S. Provisional Application No. 60/550,576 filed Mar. 5, 2004, which is incorporated herein by reference in its entirety.

BACKGROUND OF THE INVENTION

1. The Field of the Invention

The present invention relates generally to electronic circuitry. More particularly, embodiments of the present invention relate to mechanisms for using a third state applied to a digital input terminal of a circuit to initiate non-standard operational modes of the circuit.

2. Background and Relevant Art

Electronic circuitry provides great utility to a wide variety of devices and systems. A typical electronic module includes an electronic circuit protected by packaging and having a number of input/output terminals. These input/output terminals may take any form including pins, pads or the like. Surrounding circuitry may interact with the electronic module by applying and receiving signals on the input/output terminals.

Input terminals may receive signals from surrounding circuitry, and output terminals may provide signals to surrounding circuitry. Some terminals may be both input and output terminals thereby enabling bi-directional communication. Furthermore, some terminals may be configured to interact using digital signals, while others may be configured to interact using analog signals. Digital input terminals are typically configured to receive one of two binary states during normal operation.

As semiconductor processing technology has enabled smaller feature dimension sizes, the complexity of circuitry that can fit within a given die size has increased dramatically. Furthermore, as circuit complexity increases, there is a tendency for the circuit to have more input/output needs to support the increased complexity. Accordingly, the size of a given module is often limited not by the die size, but by the number of input/output terminals. In such modules, it is advantageous to reduce the number of input/output terminals as the reduction translates into the ability to reduce the module size.

BRIEF SUMMARY OF THE INVENTION

The foregoing problems with the prior state of the art are overcome by the principles of the present invention, which is directed towards a circuit module having one or more digital input terminals that are capable of receiving a third input state to initiate non-standard operational modes such as might be desired during programming or testing of the module or its surrounding circuitry. Having such specialized input terminals eliminates the need to have a separate input terminal dedicated to inducing the non-standard operational modes. Also, the use of non-standard operational mode allows other input terminals to be coupled to alternate non-standard functions. Accordingly, for circuit modules whose size is dictated by the number of input/output terminals, the circuit module size may be reduced.

For each of these special digital input terminals, there is a component that recognizes the presence of the third state applied to the corresponding input terminal. In response, the component generates a signal that causes the module to enter the non-standard operational mode. A non-standard operational mode is a mode other than the normal operational mode of the module. As an example, the non-standard operational mode might be a testing or programming mode that is encountered prior to even shipping the module to a consumer. For example, if a module interacts with an external memory, the third state may be applied to a digital input terminal to thereby disable the module from accessing the external memory so that the external memory may be programmed without interference from the module. As another example, a test mode may be initiated by applying a third state to another digital input terminal. The module may be incorporated into an optical transceiver although the principles of the present invention are not limited to that environment.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 4C illustrates an example frame in which the operation is to write or read without using an extended field, and without using CRC and acknowledgements.

DETAILED DESCRIPTION OF THE PREFERRED EMBODIMENTS

The principles of the present invention relate to a circuit module having one or more digital input terminals that are capable of receiving a third input state to initiate non-standard operational modes such as might be desired during programming or testing of the module or its surrounding circuitry. For each of these special digital input terminals, there is a component that recognizes the presence of the third state applied to the corresponding input terminal. In response, the component generates a signal that causes the module to enter a corresponding non-standard operational mode. A non-standard operational mode is a mode other than the normal operational mode of the module. As an example, the non-standard operational mode might be a testing or programming mode that is encountered prior to shipping the module to a consumer. Other input terminals may be coupled to different functions, depending on whether the circuit module is operating in standard operational mode, or non-standard operational mode. This can significantly reduce the number of I/O terminals that are required for a given functionality.

Figure 1:
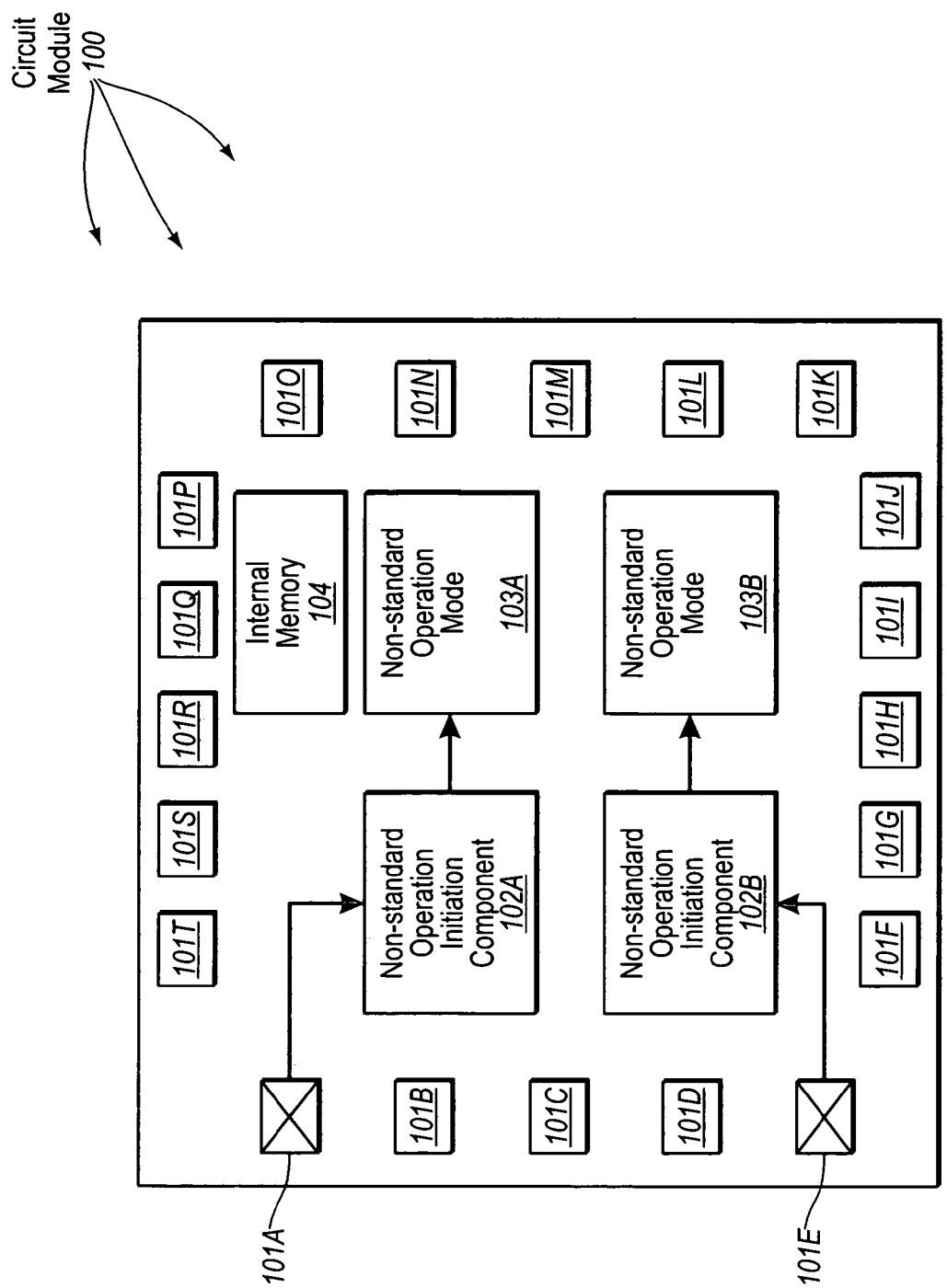
FIG. 1 schematically illustrates a circuit module that include multiple digital input terminals that are capable of receiving a third input state that initiates a non-standard operational state.

Turning to the drawings, FIG. 1 schematically illustrates a circuit module 100. The circuit module 100 has a number of input terminals labeled 101A through 101T. A few of the input terminals 101A and 101E are specialized digital input terminals as symbolically represented by the input terminals being marked with an "X". Digital input terminals are typically capable of receiving two input states, a high state and a low state. Likewise, these specialized digital input terminals 101A and 101E are capable of receiving a high state and a low state. However, when these specialized digital input terminals 101A and 101E receive a third input state (e.g., a negative voltage state), the circuit module enters a non-standard operational mode.

A non-standard operational mode is a mode other than the normal operational mode of the module. As an example, the non-standard operational mode might be a testing or programming mode that is encountered prior to shipping the module to a consumer. For example, if a module interacts with an external memory, the third state may be applied to a digital input terminal to thereby disable the module from accessing the external memory so that the external memory may be programmed without interference from the module. As another example, a test mode may be initiated by applying a third state to another digital input terminal.

Referring to the example of FIG. 1, a non-standard operation initiation component is associated with each specialized digital input terminal. For example, non-standard operation initiation component 102A receives digital input signals applied to the specialized digital input terminal 101A. When the third state is applied to the digital input signal 101A, the non-standard operation initiation component 102A causes the circuit module 100 to enter a non-standard operational mode 103A. Similarly, non-standard operation initiation component 102B receives digital input signals applied to the specialized digital input terminal 101E. When the third state is applied to the digital input signal 101E, the non-standard operation initiation component 102B causes the circuit module 100 to enter a non-standard operational mode 103B.

The non-standard operational modes 103A and 103B are symbolically illustrated as boxes although the operational modes really reflect a functional change that may occur throughout portions of the circuit module 100. As an example, the non-standard operational mode 103A may be a testing mode. In this mode, non-standard functionality is invoked. For example, a test clock signal may be used throughout the circuit module for use when testing the circuit. Accordingly, the more complex mechanisms by which a clock signal may ultimately be generated during normal operational mode need not be relied on during testing. Instead, a more reliably generated clock signal may be used.

As a further example, the non-standard operational mode 103B may be a programming mode, which once again enables non-standard functionality. For instance, the programming mode may allow for an internal memory (e.g., internal memory 104) to be programmed. Alternatively or in addition, the programming mode may cause the circuit module 101 to abstain from communicating with an external memory so that the external memory may be programmed without interference from the circuit module 100.

Although the circuit module 100 is illustrated as having twenty input terminals 101A through 101T, a circuit module that incorporates the principles of the present invention may have any number of input terminals. Furthermore, although the circuit module 100 is illustrated as having two specialized digital input terminals 101A and 101E, a circuit module that incorporates the principles of the present invention may have any number of digital input terminals capable of receiving a third state to cause the circuit module to enter a non-standard operational mode as described herein. Finally, one of ordinary skill in the art will recognize that the terminals 101 and the non-standard operation initiation components 102 are not necessarily draws to scale, and that the terminals 101 may be pins, pads, or any other mechanism for electrically connecting with surrounding circuitry.

Figure 5:
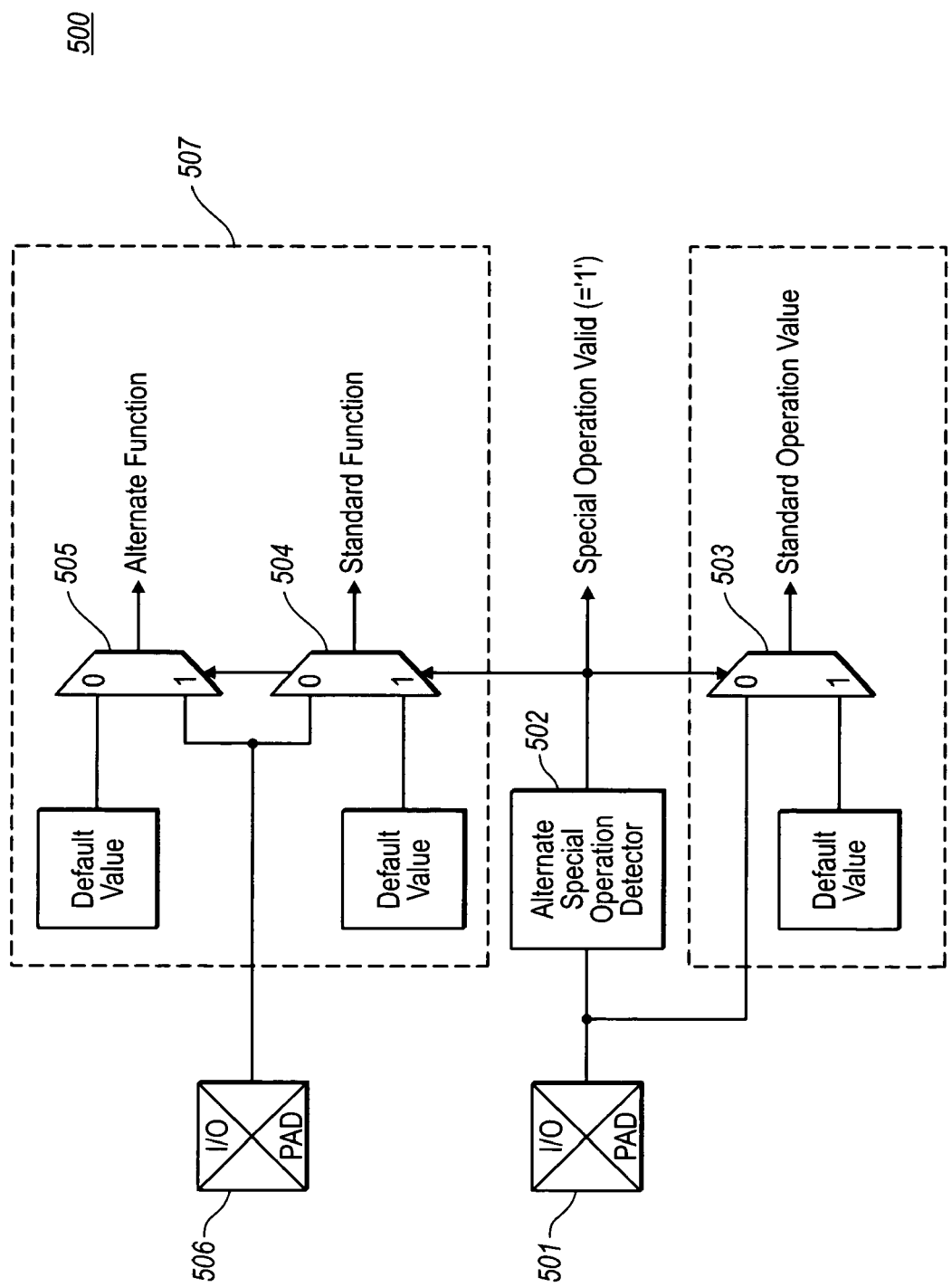
FIG. 5 schematically shows how the application of a third state to a digital input terminal may initiate a non-standard operational mode in accordance with the principles of the present invention.

FIG. 5 illustrates a schematic of how the application of a third state to a special digital input terminal 501 may cause the circuit module to enter a non-standard operational mode. Signal inputs to the digital input terminal are provided to both an alternate/special operation detector 502 and to a multiplexer.

When a normal binary state is applied to the special digital input terminal 501, the alternative/special operation detector 502 does not detect the application of a third state, and thus outputs a binary zero to multiplexers 503, 504 and 505. The multiplexer 503 in this case allows the binary state applied to the special digital input terminal 501 to be coupled as input to a standard function as a standard operation value. In this case, the digital input terminal 506 has its input coupled through multiplexer 504 to a standard function in order to support the standard operational mode of the circuit module. A default value is applied through multiplexer 505 to an alternate function. The default value may be any value that prevents the alternate function from interfering with the standard operational mode of the circuit module.

When a third binary state is applied to the special digital input terminal 501, the alternative/special operation detector 502 detects the application of the third state, and thus outputs a binary one to multiplexers 503, 504 and 505. The multiplexer 503 in this case causes a default value to be provided to a standard function, the default value selected so as not to interfere with the non-standard operational mode of the circuit module. Similarly, the multiplexer 504 causes a default value to be provided to a standard function, where the default value does not interfere with the non-standard operational mode of the circuit module. The multiplexer 505 allows the signal applied to the other digital input terminal 506 to be coupled as input to the alternate function to thereby support the operation of the non-standard operational mode of the circuit module.

In this example, the digital input terminal 501 may be, for example, the same as the special digital input terminal 101A of FIG. 1. Likewise, the digital input terminal 506 may be, for example, the same as the digital input terminal 101B of FIG. 1. The circuitry encapsulated by the dashed box 507 may be replicated for other digital input terminals such that multiple input terminals may have their functionality changed for depending on whether or not a third state is applied to the special digital input terminal 501. For example, the circuitry 507 may be replicated for digital input terminals 101C and 101D of FIG. 1, to allow the application of a third state to digital input terminal 101A to be used to control the coupling of the digital input terminals 101B through 101D to alternate functions. Accordingly, the use of such non-standard operational modes may significantly reduce the number of required I/O terminal to support given functionality.

Having now described the principles of the present invention, a particular environment in which such a circuit module may be employed will be described with respect to FIG. 2. Specifically, the environment described is a telecommunications system. However, those of ordinary skill in the art will recognize after having reviewed this description that the principles of the present invention may be incorporated with utility into any circuit module.

Figure 2:
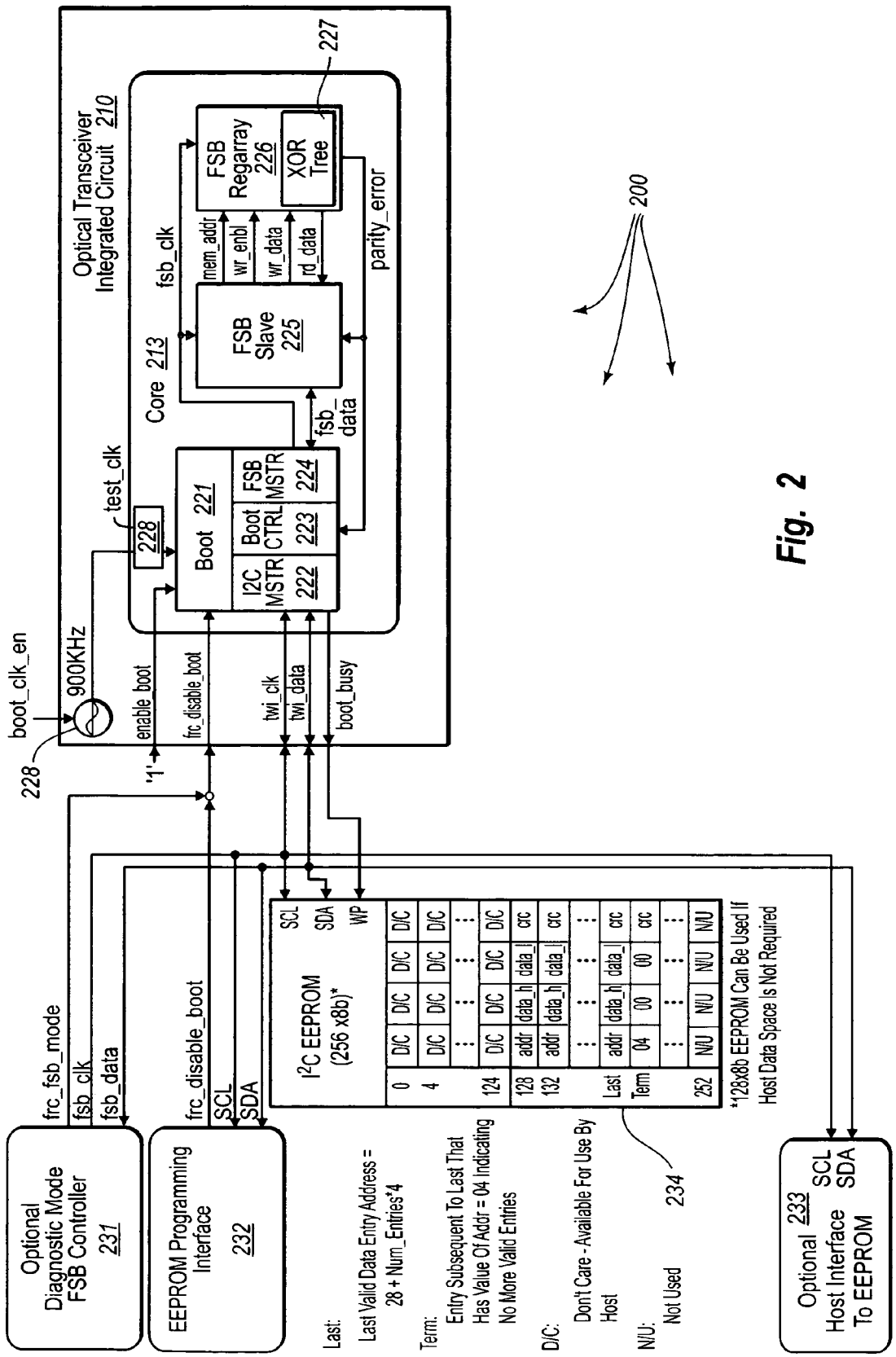
FIG. 2 schematically illustrates an example environment in which the circuit module of FIG. 1 may be incorporated.

For example, FIG. 2 schematically illustrates a telecommunications system 200. The components described with respect to FIG. 2 may be located within an optical transceiver or distributed through a telecommunications system, rather than being exclusively contained within the optical transceiver. The telecommunications system 200 of FIG. 2 includes an optical transceiver integrated circuit 210, which represents an example of the circuit module 100 of FIG. 1. The optical transceiver integrated circuit 210 includes a digital core component 213 that includes a boot component 221, an FSB slave component 225 and an FSB register array component 226. FSB stands for "Finisar Serial Bus" and is a Finisar-proprietary two-wire interface. The slave component 225 and the register array 226 are labeled as FSB components because they may communicate using the FSB two-wire interface. However, the principles of the present invention are not limited to any specific manner of communication within the optical transceiver. More regarding the FSB two-wire interface is described below with respect to FIGS. 3, 4A, 4B and 4C. The telecommunications system 200 also may include a transient system clock 228. This transient system clock 228 is selectively configurable to generate or abstain from generating a clock signal.

Settings for controlling a post-amplifier and a laser driver (not shown) of the optical transceiver may be memory mapped using the FSB register array component 226. The FSB slave component 225 reads data from and writes data to specified address locations within the FSB register array component 226 in response to specific FSB commands received from or through the boot component 221. Specifically, the FSB slave component 225 may generate signal mem_addr to address a location within the FSB register array 226, signal wr_enable to enable a write operation, and signal wr_data to specify the data to be written. In addition, the FSB slave component may read signal rd_data to read data from the specified memory address. The FSB register array 226 includes an XOR tree 227 which generates a parity_error signal if there is a parity error detected in the FSB register array 226.

The boot component 221 operates while the telecommunications system 200 is initializing. Specifically, during initialization, the boot component 221 coordinates the proper loading of appropriate data from an external EEPROM 234 into the FSB register array 226. The EEPROM 234 represents an example of external memory 121 of FIG. 1. Once initialization completes, the telecommunications system may communicate. The post-amplifier and the laser driver are then controlled based on the values within the FSB register array 226.

During initialization, the boot component 221 is active. This state is manifested to the boot component by the signal enable_boot being high. Even in this active state, the boot component 221 may be temporarily disabled by asserting the signal frc_disable_boot signal high. The signal frc_disable_boot (standing for "force disable reboot") is rarely applied, and only occurs if the boot operation is repeatedly not successful in resolving a problem. In one embodiment, the frc_disable_boot signal may be applied by applying a third state to a special digital input terminal (e.g., input terminal 101A of FIG. 1). For instance, when an external component detects that rebooting is not resolving a problem, the external component may apply the third state to the digital input terminal that normally receives binary input. This may, in turn, cause the signal frc_disable_boot to be asserted. Accordingly, the force disable reboot functionality may be added to the circuit module without adding an additional I/O terminal dedicated for that purpose.

During initialization (during which time the boot component 221 is active and not temporarily disabled), the boot component 221 communicates with the memory 234 using the conventional I²C two-wire interface. In particular, the boot control component 223 of the boot component 221 causes the I²C master component 222 of the boot component 221 to communicate with the EEPROM memory 234 using the I²C-compliant clock, data, and write protect signals. The clock signal is represented in FIG. 2A by signal SCL from the EEPROM perspective and signal twi_Clk from the boot component perspective. The data signal is represented by signal SDA from the EEPROM perspective and signal twi_data from the boot component perspective. The write disable signal is represented by signal WP from the EEPROM perspective and by signal boot_busy from the boot component 221 perspective. The I²C two-wire interface and these corresponding signals are well-known to those of ordinary skill in the art.

Also during initialization, the boot component 221 may communicate with and control the FSB slave component 225 using the FSB two-wire interface. In particular, the boot component 221 may use the boot control component 223 to control the FSB master component 224. In response, the FSB master component 224 provides an appropriate clock signal fsb_clk to the FSB slave component 225 and the FSB register array 226. Also, the FSB master component 224 provides a data signal fsb_data to the FSB slave component 225. The fsb_clk and fsb_data signals are provided in conformity with the FSB two-wire interface described below with respect to FIGS. 3, 4A, 4B and 4C.

The boot logic component 223 is configured such that when the telecommunications system 200 is initializing, the appropriate data is loaded from the EEPROM 234 into the FSB register array 226. As previously mentioned, doing so involves communication with the EEPROM 234 using one two-wire interface while communicating with other components (e.g., the FSB slave component 225) using a different two-wire interface. To enable this initialization communication, a clock signal is needed. Accordingly, the system clock 228 generates a clock signal during initialization mode. However, after initialization, the system clock 228 is disabled since the post-amplifier and laser driver operate based on the values within the FSB register array 226, and does not need further clock-based communication by the boot component 221. The system clock 228 is disabled by pulling the signal enable_boot low. This causes the signal boot_clk emitted by the AND gate 229 to be low, thereby disabling the system clock 228.

The configuration of FIG. 2 also illustrates several other external components. For instance, when optional diagnostic mode FSB controller 231 asserts signal frc_fsb_mode, the signal frc_disable_boot signal is likewise asserted, thereby disabling the boot controller 221. This allows the diagnostic mode FSB controller 231 to communicate straight through the boot component 221 and to the FSB slave component 225 using the FSB two-wire interface using clock signal fsb_clk and data signal fsb_data. In this configuration the diagnostic mode FSB controller 231 behaves as an FSB master component. Accordingly, the diagnostic mode FSB controller 231 may control the FSB slave component 225 to thereby cause appropriate diagnostics to be made on the FSB register array 226.

Also, the EEPROM programming interface 232 may likewise assert the frc_disable_boot signal to at least temporarily disable any boot operations. Specifically, the EEPROM programming interface may assert a third state on one of the specialized digital input terminals that corresponds to the non-standard programming mode. The corresponding non-standard operation initiation component then causes the core component 213 to enter the programming mode by asserting the frc_disable_boot signal thereby shutting down communication between the core component 213 and the EEPROM 234. The EEPROM programming interface 232 may then communicate with the EEPROM 234 using the SCL and SDA signals in accordance with the conventional I²C two-wire interface. By disabling the boot process during the EEPROM programming, the risk of contention on the clock signal SCL and data signal SDA is significantly reduced. An optional host interface to EEPROM 233 may also be provided to allow a host computing system to interface with the EEPROM.

The optical transceiver integrated circuit may also operate in a test mode. For instance, during test mode, a test clock signal test_clk is provided through the multiplexer 228 rather than the normal clock signal boot_clk. This mode may likewise have been initiated by the tester asserting a third state on a specialized digital input terminal. The corresponding non-standard operation initiation component may detect this third state and in response generate a signal that controls the multiplexer 228 so that the test clock signal text_clk is passed to the boot component 221. Accordingly, during testing, the tester need not rely on more complex functionality required to generate the normal clock signal boot_clk.

Therefore, programming and testing modes may be invoked by applying a third state to an existing digital input terminal, rather than having to add an input terminal for the purpose of invoking the non-standard operational modes. Accordingly, the terminal count is kept lower thereby potentially reducing the size of the circuit module. Furthermore, during normal operation, the specialized digital input terminals may serve their normal purpose of supporting communication required for normal operations.

Accordingly, a specific environment in which the circuit module of FIG. 1 may operate has been described with respect to FIG. 2. It should be noted that while some embodiments of the invention are well-suited for use in conjunction with a high speed data transmission system conforming to the Gigabit Ethernet ("GigE") physical specification, such operating environment is exemplary only and embodiments of the invention may, more generally, be employed in any of a variety of high speed data transmission systems, some of which may have line rates up to, or exceeding, 1 G, 2.5 G, 4 G, 10 G and higher bandwidth fiber channels. For example, some embodiments of the invention are compatible with the Fibre Channel ("FC") physical specification.

Further, embodiments of the invention may be implemented in various ways. By way of example, some embodiments of the PA/LD are implemented in Small Form Factor Pluggable ("SFP") bi-directional transceiver modules. Such transceiver modules are configured for GigE and/or FC compliance. Exemplarily, such transceiver modules are capable of transmitting and/or receiving at a wavelength of about 850 nm. Moreover, these transceiver modules can operate over a wide range of temperatures. For example, some of such transceiver modules are effective over a temperature range of about 80° C., such as from about −10° C. to about +70° C. Of course, such embodiments and associated operating parameters are exemplary only, and are not intended to limit the scope of the invention in any way. For example, the principles of the present invention may be implemented in laser transmitter/receivers of any form factor such as XFP, SFP and SFF, without restriction.

Having described a specific environment in which the principles of the present invention may be employed with respect to FIG. 2, the FSB two-wire interface mentioned in the description of FIG. 2 will be described in further detail with respect to FIGS. 3, 4A, 4B and 4C.

Figure 3:
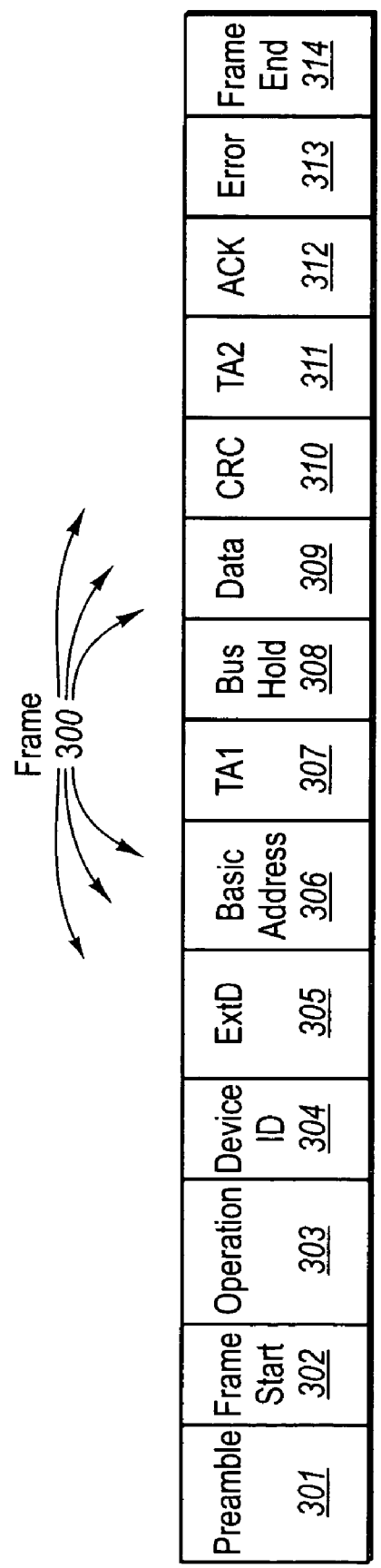
FIG. 3 schematically illustrates a sequential data structure of a frame that defines an FSB two-wire interface.

FIG. 3 illustrates a schematic diagram of a data structure 300 of a frame of an FSB two-wire interface mentioned briefly above with respect to FIG. 2. The frame 300 includes a preamble field 301, a frame start field 302, an operation field 303, a device identifier field 304, an optional extended field 305, a basic address field 306, a first bus turnaround field 307, and optional bus hold field 308, a data field 309, an optional Cyclic Redundancy Checking (CRC) field 310, a second bus turnaround field 311, an optional acknowledgement field 312, an optional error status field 313, and a frame end field 314. As will be explained in further detail below, the frame 300 is designed so that within any component's turn for control of the data wire, there is a guaranteed zero interspersed more frequently than the length of the preamble.

The bus turnaround fields allow for optional transfer of data wire control between the FSB master component and the FSB slave component. Accordingly, the FSB master component may be providing some of the frame, while the FSB slave component may be providing other portions of the frame. Note that while a specific ordering of fields is shown in FIG. 3, there is considerable flexibility as to the ordering of the fields without adversely affecting the functionality of the frame 300 as will be apparent to those of ordinary skill in the art after having reviewed this description.

Figure 4A:
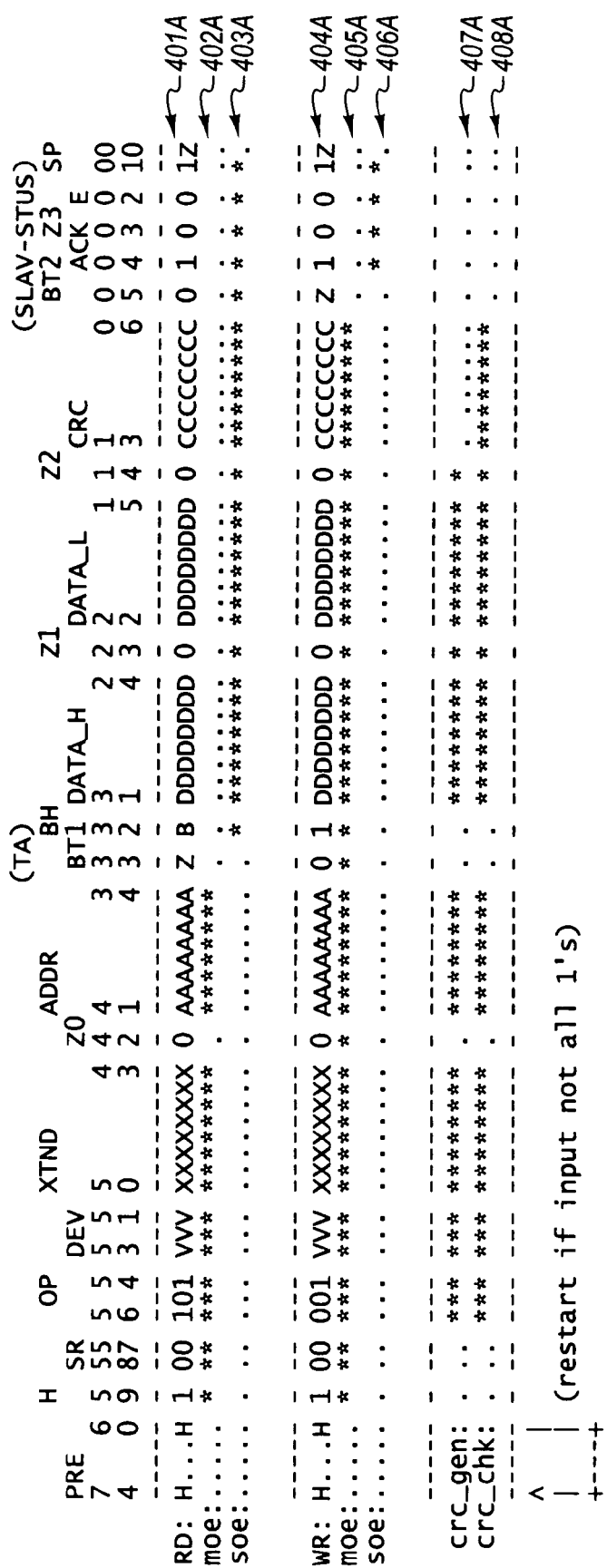
FIG. 4A illustrates an example frame in which the operation is to write or read using an extended field, and using Cyclic Redundancy Checking (CRC) and acknowledgements.
Figure 4B:
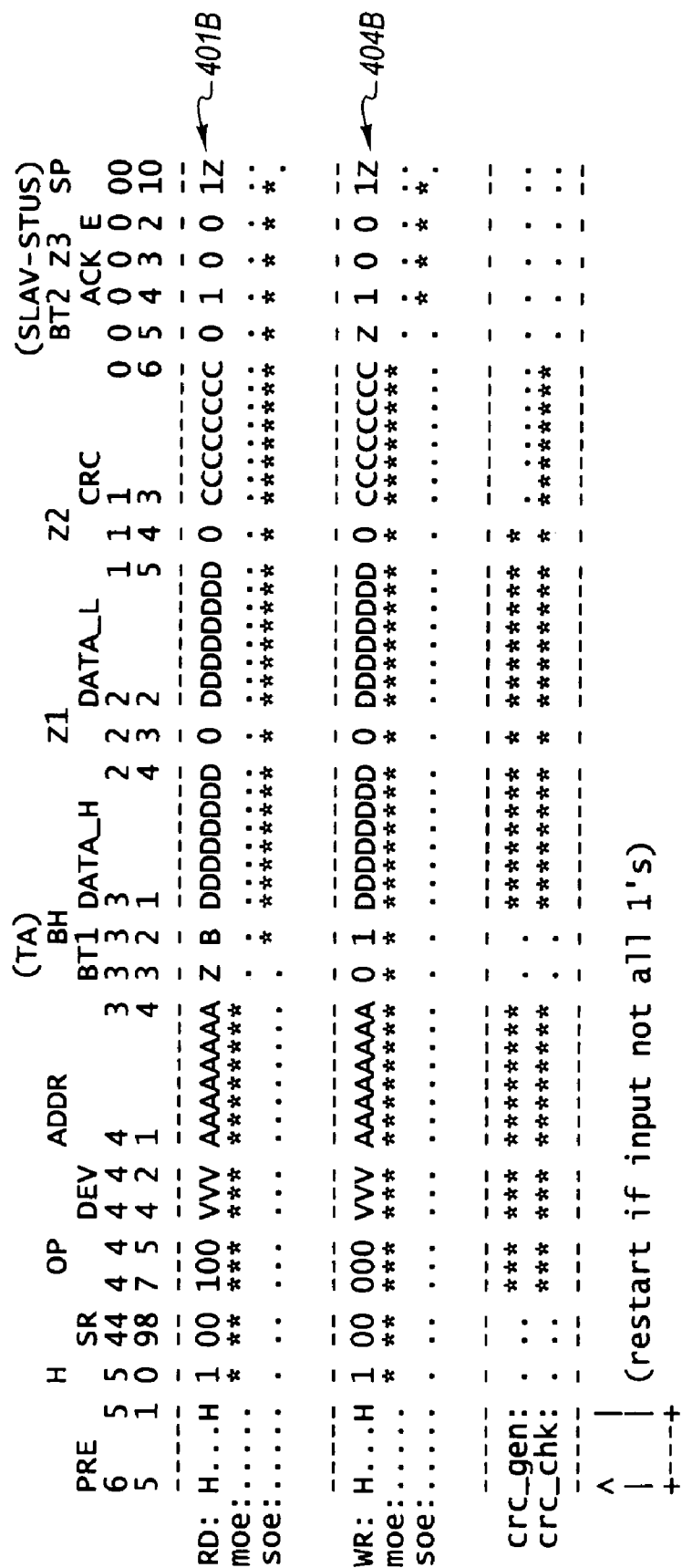
FIG. 4B illustrates an example frame in which the operation is to write or read without using an extended field, and using CRC and acknowledgements.

FIGS. 4A, 4B and 4C show specific embodiments of the frame 300. Some of the optional fields are included or excluded depending on the operation being performed. FIG. 4A illustrates an example frame in which the operation is to write or read using an extended field, and using Cyclic Redundancy Checking (CRC) and acknowledgements. FIG. 4B illustrates an example frame in which the operation is to write or read without using an extended field, and using CRC and acknowledgements. FIG. 4C illustrates an example frame in which the operation is to write or read without using an extended field, and without using CRC and acknowledgements.

Since FIG. 4A illustrates the most inclusive frame example, the various fields of the frame will be described in most detail with respect to FIG. 4A. The frame of FIG. 4A includes 75 bits corresponding to bits 74:0, regardless of whether the operation is a read operation as specified in line 401A or a write operation as specified in line 404A.

Line 402A illustrates an asterix at time increments when the FSB master component is in control of the data wire during a read operation, and otherwise contains a period. "MOE" at the beginning of the line stands for "Master data Output Enable". Line 403A illustrates an asterix at time increments when the FSB slave component is in control of the data wire during a read operation, and otherwise contains a period. "SOE" at the beginning of the line stands for "slave data Output Enable".

Similarly, line 405A illustrates an asterix at time increments when the FSB master component is in control of the data wire during a write operation, and otherwise contains a period. Furthermore, line 406A illustrates an asterix at time increments when the FSB slave component is in control of the data wire during a write operation, and otherwise contains a period. Lines 407A and 408A will be explained further below.

The frame begins with a preamble as represented in FIG. 4A by the 15 bits 74:60. This preamble is an example of the preamble field 301 of FIG. 3. The data wires of FIG. 2 are left in a high impedance state. Absent any assertion on the data wire by FSB master component or any of the FSB slave component(s), the data wire is held to a logical one by a pull-up resistor. When the FSB master component determines that a communication is to be made with FSB slave component, the FSB master component generates a clock signal on the clock wire. At the same time, each clock cycle, the FSB master component monitors the data wire for fifteen consecutive ones. The high impedance data wire does allow for proper assertion of data on the data wire despite the presence of the pull-up resistor.

If the FSB master component is not asserting anything on the data wire during the preamble phase, then the data wire should carry a logical one if none of the FSB slave components is transmitting the remainder of a prior frame on the data wire. Alternatively, even if the FSB master component may be asserting a logical one on the data wire during at least some of the preamble, then the data wire should still be carrying the logical one during the preamble phase assuming that none of the FSB slave components is transmitting on the data wire at that time. On the other hand, the frame is designed such that neither a FSB master nor a FSB slave transmits more than fifteen consecutive logical ones in a row when transmitting none-preamble portions of the frame.

Given the above, if the FSB master component detects a logical zero on the data wire while monitoring the data wire during the preamble phase of the frame, then a FSB slave component is likely communicating on the data wire. Whether or not logical zeros are detected, the FSB master component will wait until there are fifteen cycles of logical ones on the data wire before continuing with the frame. Due to the interspersed guaranteed zeros within the frame design, it is then that the FSB master component may safely transmit on the data wire with little risk that one of the FSB slave component(s) is also communicating on the data wire.

Accordingly, even if there is an error in synchronization between the FSB master component and the FSB slave component, synchronization is reacquired as the FSB master component waits for the FSB slave component to complete its use of the data wire before proceeding. The FSB slave component also monitors the data wire for fifteen consecutive ones. Accordingly, when the FSB slave component encounters fifteen consecutive ones, the FSB slave component awaits the rest of the frame. Accordingly, since the FSB slave component is not using the data wire at the time of the preamble regardless of whether the FSB slave component had previously lost synchronization with the FSB master component, the FSB slave component should be listening for the preamble at the preamble phase of the frame. Accordingly, the FSB slave component reacquires synchronization with the FSB master component.

Therefore, the preamble is significantly shortened while further retaining error recovery from loss of synchronization. Furthermore, since the data wire is biased high due to the pull-up resistor, the FSB master component need not assert any data on the data wire during the preamble phase, thereby reducing power requirements.

Once the preamble phase is completed (i.e., the FSB master component has detected at least fifteen consecutive binary ones on the data wire), the FSB master component asserts a logical one on the data wire as represented by bit 59. This turns on the output enable for the FSB master component, and maintains the data wire at the logical one for one more cycle.

The FSB master component then transmits two start of frame bits 58:57 which are guaranteed logical zeros. These start of frame bits are an example of the start of frame field 302 of FIG. 3. After the preamble phase is complete, the FSB slave component(s) are listening for these logical zeros. When they arrive, the FSB slave component(s) a understand that the two logical zeros correspond to the start of the rest of the frame, thereby attaining synchronization. Two logical zeros are provided in order to provide sufficient statistical probability that the two logical zeros do indeed represent the start of a frame.

The FSB master component then transmits three operation code bits 56:54. These operation code bits are an example of the operation field 303 of FIG. 3. The three operation code bits would normally permit eight unique operations to be identified. However, in order to guarantee at least one logical zero in this operation code, the number of operations represented by the three bits is six, with the other two permutations of the operation code being reserved. In the illustrated example, bit sequences 011 and 111 are reserved.

In the example, operations bits 000 mean a write operation without using an extended field (explained further below), but with CRC checking and acknowledgements. A frame for this operation is shown in line 404B of FIG. 4B (see bits 47:45 of line 404B).

Operation bits 001 mean a write operation using an extended field, and with CRC checking and acknowledgments. A frame for this operation is shown in line 404A of FIG. 4A (see bits 56:54 of line 404A).

Operation bits 010 mean a write operation without using an extended field, and without CRC checking and acknowledgments. A frame for this operation is shown in line 404C of FIG. 4C (see bits 35:33 of line 404C).

Operations bits 100 mean a read operation without using an extended field, but with CRC checking and acknowledgements. A frame for this operation is shown in line 401B of FIG. 4B (see bits 47:45 of line 401B).

Operation bits 101 mean a read operation using an extended field, and with CRC to checking and acknowledgments. A frame for this operation is shown in line 401A of FIG. 4A (see bits 56:54 of line 401A).

Operation bits 110 mean a read operation without using an extended field, and without CRC checking and acknowledgments. A frame for this operation is shown in line 401C of FIG. 4C (see bits 35:33 of line 401C).

Note how the structure of the frame differs depending on the operation. Accordingly, the FSB master component controls which frame structure is to be used by controlling the operation code. Upon reading the operation code, the FSB slave component is configured to expect the frame structure corresponding to the operation code. Accordingly, the FSB master component may dynamically adjust the frame structure as needed. In times when bandwidth is more of a concern, the shorter and less reliable frame structure (e.g., FIG. 4C) may be used. In times when reliability is more of a concern, the longer and more reliable frames structure (e.g., FIGS. 4A and 4B) may be used. When further bits are needed for any reason, the frame with the extended field (e.g., FIG. 4A) may be used. When these further bits are not needed, the frames without the extended field (e.g., FIGS. 4B and 4C) may be used.

Referring back to FIG. 4A, after the FSB master component transmits the operation code (i.e., bits 56:54), the FSB master component transmits a three bit device identifier corresponding to bits 53:51. These device identifier bits are an example of the device identifier field 304 of FIG. 3. The device identifier identifies which FSB slave component of the FSB slave component(s) that the FSB master component is to communicate with. Since three bits are used for the device identifier in this embodiment, there may be up to eight FSB slave components in this embodiment (or seven FSB slave components if the FSB master component is to also have an address for self-diagnostic purposes).

Until the time that the device identifier bits are provided, each of the FSB slave component(s) was monitoring the communications over the data wire. However, upon receiving the device identifier bits, the FSB slave component may identify itself as corresponding to the device identifier. The other FSB slave components, if any, may ignore the rest of the frame. Even though the other FSB slave components ignore the rest of the frame, the other FSB slave components may immediately continue monitoring the data wire for another preamble indicative of another frame being transmitted. Alternatively, the other FSB slave component may initiate such monitoring after clock signals are once again asserted on the clock wire indicating that the next frame is about to begin.

After the FSB master component asserts the device identifier bits 53:51 on the data wire, the FSB master component asserts eight bits 50:43 that correspond to an extended field. These extended bits are an example of the extended field 305 of FIG. 3. In the case of FIG. 4A, the operation code causes the FSB slave component to expect these extended bits. The FSB master component then transmits a guaranteed logical zero as bit 42 thereby ensuring that fifteen consecutive logical ones on the data wire means that a frame is in the preamble phase to thereby support the above-described synchronization recovery mechanism.

The extended field may include any extended bits that are useful so long as the meaning of the bits is commonly recognized by both communicating components. For example, some or all of the extended field may represent an extended address for use when communicating with FSB slave components having larger address spaces. Alternatively or in addition, some or all of the extended field may represent an extended operation code where further operation types are desired.

The FSB master component then asserts eight bits 41:34 that correspond to the basic address. These eight bits 41:34 are an example of the basic address field 306 of FIG. 3. If all of the extended field represents an extended address, the FSB slave component may use all of the sixteen bits 50:43 and 41:34 to properly identify the address space that applies to the operation.

The next bit 33 in the frame is a first turnaround bit and represents an example of the first turnaround field 307 of FIG. 3. The turnaround bits are somewhat unique in that they allow for optional exchange of control of the data wire between the FSB master component and the FSB slave component.

In the case of a write operation, the first turnaround bit 33 is a logical zero, indicating that control is to stay for the time being with the FSB master component. Accordingly, referring to line 405A of FIG. 4A, the FSB master component retains control of the data wire through the turnaround bit 33; and referring to line 406A of FIG. 4A, the FSB slave component does not gain control of the data wire through the turnaround bit 33. This retaining of control is appropriate since the FSB master component is the one that is providing that data that is the subject of a write operation initiated by the FSB master component.

On the other hand, in the case of a read operation, the first turnaround bit 33 is a high-z, meaning that the data wire is permitted to float at its high impedance state in which none of the FSB master component or FSB slave component is actively asserting bits on the data wire. This represents that control of the data wire has passed to the FSB slave component (see lines 402A and 403A of FIG. 4A). This transfer of control is appropriate since the FSB slave component is the one that is providing that data that is the subject of a is read operation initiated by the FSB master component.

In the case of a read operation, the FSB slave component then has the opportunity to pause the frame in cases in which the FSB slave component is not ready to continue at this stage. The FSB slave component asserts the bus hold bit 32 to a logical zero if it is not ready to continue. When ready to continue, the FSB slave component asserts a logical one if it is ready to proceed thereby given the FSB master component notice that the FSB slave component is ready to continue. This provides the FSB slave component with an option to pause the frame when the FSB slave component is not ready to continue for the time being. An additional pausing option available to the FSB slave component is described below with respect to the acknowledgement bit. In the case of a write operation, the bus hold bit 32 is a guaranteed logical one. The bus hold bit 32 is an example of the bus hold field 308 of FIG. 3.

In the case of a read operation, after the FSB slave component transmits the bit hold bit 32, the FSB slave component transmits the eight most significant bits followed by a guaranteed zero bit. In the case of a write operation, after the FSB master component transmits the bit hold bit 32, the FSB master component transmits the eight most significant bits followed by the guaranteed zero bit. In either case, the eight most significant bits are represented by bits 31:24, and the following guaranteed zero bit is represented by bit 23.

In the case of a read operation, after the FSB slave component transmits the guaranteed zero bit 23, the FSB slave component transmits the eight least significant bits followed by another guaranteed zero bit. In the case of a write operation, after the FSB master component transmits the guaranteed zero bit 23, the FSB master component transmits the eight least significant bits followed by the other guaranteed zero bit. In either case, the eight least significant bits are represented by bits 22:15, while the other guaranteed zero bit is represented by bit 14. The combination of the data bits 31:24 and 22:15 are an example of the data field 309 of FIG. 3.

In the case of a read operation, after the FSB slave component transmits the guaranteed zero bit 14, the FSB slave component transmits eight bits of Cyclic Redundancy Checking (CRC) data corresponding to bits 13:06. The CRC bits are one example of the CRC field 310 of FIG. 3. Using all the bits after the start of frame bits 58:57 and prior to the CRC bits 13:06, both the FSB master component and the FSB slave component calculate CRC data as shown in line 507A. When the FSB master component receives the CRC bits 13:06 back from the FSB slave component, the FSB master component then compares the CRC information generated by both the FSB master component and the FSB slave component as represented by line 408A. If there is a mismatch, then there has likely been an error in transmission, and the FSB master component may begin the frame again after the current frame is ended.

In the case of a write operation, after the FSB master component transmits the guaranteed zero bit 14, the FSB master component transmits the CRC bits 13:06. Once again, both the FSB master component and the FSB slave component calculate their CRC data. When the FSB slave component receives the CRC bits 13:06 from the FSB master component, the FSB slave component then compares the CRC information generated by both the FSB master component and the FSB slave component. If there is a mismatch, then there has likely been an error in transmission, and the FSB master component may begin the frame again after the current frame is ended after the FSB master component has been notified of the error. In some cases, an erroneous write operation may have catastrophic (or at least harmful) effects. For example, if the erroneous write operation was for setting a laser bias current, the laser strength could be too strong such that signal distortion occurs. Accordingly, reliable communications is important in such circumstances. The FSB slave component may elect to suppress a write operation when such an error is detected.

After the CRC bits 13:06, there is a second turnaround bit 05. This second turnaround bit is an example of the second turnaround field 311 of FIG. 3. This turnaround operation allows control of the data wire to be given to the FSB slave component if control is not there already. This allows the FSB slave component to give reliability information back to the FSB master component.

In the case of a read operation, control of the data wire has already been passed to the FSB slave component using the first turnaround bit. Accordingly, this second turnaround bit is a logical zero indicating no change in control of the data wire. On the other hand, in the case of a write operation, control of the data wire was not previously given to the FSB slave component using the first turnaround bit. Accordingly, the data wire is allowed to float at its high impedance state indicating a transfer of control of the data wire to the FSB slave component. Accordingly, after the second turnaround bit 05, the FSB slave component has control of the data wire regardless of whether the operation is a read operation or a write operation.

After the second turnaround bit 05, the FSB slave component asserts an acknowledgment bit 04, which is an example of the acknowledgement field 312 of FIG. 3. This acknowledgement bit may represent whether or not the operation was successful. In this case, a logical one means successful completion of the operation. Had the FSB slave component been too busy to respond to the FSB master component, the FSB slave component may assert a logical zero for the acknowledgement bit 04, thereby forcing the FSB master component to reinitiate the frame. Accordingly, the acknowledgment bit 03, and the bit hold bit 32 provide a way for the FSB slave component to address the situation where it cannot respond to the request.

The FSB slave component then asserts a guaranteed zero bit 03, followed by an error bit 02, which is an example of the error field 313 of FIG. 3. The error field may indicate whether or not there was an error in CRC checking and/or a violation of the protocol (e.g., a logical one is detected where a logical zero should occur). In the case of a read operation, the FSB master component will already be in possession of CRC data sufficient to make this determination. However, in the case of a write operation, the FSB slave component is the one that made the comparison of CRC data. Accordingly, it is at this time that the FSB slave component notifies the FSB master component of any mismatch in CRC data. A mismatch would result in the FSB master component reinitiating the frame. The presence of CRC and acknowledgment information in the frame allows for more reliable communication between the FSB master component and the FSB slave component(s).

The FSB slave component then asserts two end of frame bits 01:00, which indicates the end of the frame. The first bit 01 is a logical one, which forces the data bus immediately to a logical one. In the second bit, the data bus is allowed to float at its high impedance state, ready for the next frame to begin. If the first bit 01 were a logical zero, it may take some time for the pull-up resistor to pull the data wire up to a voltage level that could be interpreted as a logical one. Accordingly, the setting of the first bit 01 at a logical one means that the next frame may begin sooner, thereby improving performance.

FIG. 4B illustrates an example frame in which the operation is to write or read without using an extended field, and using CRC and acknowledgements. The frame of FIG. 4B is similar to that described above with respect to FIG. 4A, except that the operation is to write or read without using the extended field. Accordingly, bits 50:42 of FIG. 4A are absent from FIG. 4B and the bits are renumbered accordingly.

FIG. 4C illustrates an example frame in which the operation is to write or read without using an extended field, and without using CRC and acknowledgements. The frame of FIG. 4C is similar to that described above with respect to FIG. 4A, except that the operation is to write or read without using the extended field. Accordingly, bits 50:42 of FIG. 4A are absent from FIG. 4B. Furthermore, there is no reliability information within the frame. Hence, bits 13:02 of FIG. 4A are absence from FIG. 4C. The absence from FIG. 4C of bits that are present in FIG. 4A warrants the renumber of the remaining bits in FIG. 4C.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

The invention claimed is:

1. A circuit module comprising the following:
   at least one digital input terminal, the circuit module being configured to be in a standard operational mode when a first or second state is applied to the digital input terminal; and
   an alternate special operation detector component configured to receive digital input signals applied to the digital input terminal and cause the circuit module to enter a non-standard operational mode when a third state is applied to the digital input terminal, wherein the non-standard operational mode is a programming mode and wherein the circuit module is configured to abstain from communicating with an external memory during the programming mode.

2. A circuit module in accordance with claim 1, wherein the circuit module is configured to allow internal memory to be programmed during the programming mode.

3. A circuit module in accordance with claim 1, wherein the circuit module is incorporated into a telecommunications system.

4. A circuit module in accordance with claim 1, wherein the circuit module is incorporated into an optical transceiver.

5. A circuit module in accordance with claim 1, wherein the digital input terminal is a first digital input terminal, and the at least one digital input terminal comprises a second digital input terminal, wherein the second digital input terminal is coupled to a standard function when the circuit module is in the standard operational mode, and is coupled to an alternate function when the circuit module is in the non-standard operational mode.

6. A circuit module in accordance with claim 5, wherein when the second digital input terminal is coupled to the alternative function, a default value is provided to the standard function.

7. A circuit module comprising the following:
a first digital input terminal, the circuit module being configured to be in a first standard operational mode when a first or second state is applied to the first digital input terminal;
a first non-standard operation initiation component configured to receive digital input signals applied to the first digital input terminal and cause the circuit module to enter a first non-standard operational mode when a third state is applied to the first digital input terminal;
a second digital input terminal, the circuit module being configured to be in a second standard operational mode when a first or second state is applied to the second digital input terminal; and
a second non-standard operation initiation component configured to receive digital input signals applied to the second digital input terminal and cause the circuit module to enter a second non-standard operational mode when a third state is applied to the first digital input terminal.

8. A circuit module in accordance with claim 7, wherein the first or second non-standard operational mode is a testing mode for testing the circuit module.

9. A circuit module in accordance with claim 8, wherein the circuit module is configured to operate using a test clock signal during the testing mode.

10. A circuit module in accordance with claim 7, wherein the first or second non-standard operational mode is a programming mode.

11. A circuit module in accordance with claim 10, wherein the circuit module is configured to allow internal memory to be programmed during the programming mode.

12. A circuit module in accordance with claim 10, wherein the circuit module is configured to abstain from communicating with an external memory during the programming mode.

13. A circuit module in accordance with claim 7, wherein the second digital input terminal is coupled to a standard function when the circuit module is in the standard operational mode, and is coupled to an alternate function when the circuit module is in the non-standard operational mode.

14. A circuit module in accordance with claim 13, wherein when the second digital input terminal is coupled to the alternative function, a default value is provided to the standard function.

15. A circuit module comprising the following:
first and second digital input terminals, the circuit module being configured to be in a standard operational mode when a first or second state is applied to the first digital input terminal; and
a non-standard operation initiation component configured to receive digital input signals applied to the first digital input terminal and cause the circuit module to enter a non-standard operational mode when a third state is applied to the first digital input terminal, wherein the second digital input terminal is coupled to a standard function when the circuit module is in the standard operational mode, and is coupled to an alternate function when the circuit module is in the non-standard operational mode.

16. A circuit module in accordance with claim 15, wherein the non-standard operational mode is a testing mode for testing the circuit module.

17. A circuit module in accordance with claim 16, wherein the circuit module is configured to operate using a test clock signal during the testing mode.

18. A circuit module in accordance with claim 15, wherein when the second digital input terminal is coupled to the alternative function, a default value is provided to the standard function.

* * * * *

UNITED STATES PATENT AND TRADEMARK OFFICE
CERTIFICATE OF CORRECTION

PATENT NO. : 7,332,928 B2
APPLICATION NO. : 11/074607
DATED : February 19, 2008
INVENTOR(S) : Moran et al.

It is certified that error appears in the above-identified patent and that said Letters Patent is hereby corrected as shown below:

Col. 2
Line 46 change "include" to --includes--

Col. 4
Line 15 change "101" to --100--

Col. 5
Line 8 change "changed for" to --changed--

Col. 6
Line 4 delete "121 of FIG. 1"
Line 34 change "2a" to --2--
Line 35 change "twi_Clk" to --twi_clk--

Col. 7
Line 5 reference number 229 does not appear in the figures.
Line 42 change "multiplexer 228" to --multiplexer test clock 228--

Col. 9
Line 10 change "MOE" to --moe--
Line 14 change "SOE" to --soe--

Col. 10
Line 29 change "a understand" to --understand--

Col. 12
Line 20 change "that data" to --the data--
Line 30 change "that data" to --the data--
Line 31 change "is read" to --read--
Line 39 change "given" to --giving--

Signed and Sealed this

Twenty-first Day of December, 2010

David J. Kappos
*Director of the United States Patent and Trademark Office*

Col. 13
Line 12 change "507A" to --407A--

Col. 16
Line 45 change "15" to --13--